Figure 1:
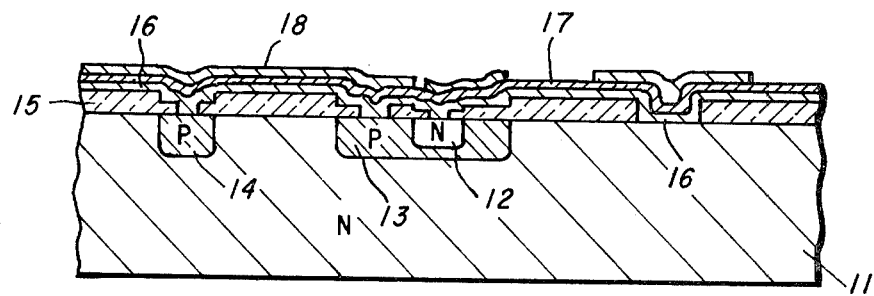

United States Patent [19]

Fuller et al.

[11] 4,035,208

[45] July 12, 1977

[54] METHOD OF PATTERNING CR-PT-AU METALLIZATION FOR SILICON DEVICES

[75] Inventors: Clyde Rhea Fuller; Barry William Battershall, both of Plano, Tex.

[73] Assignee: Texas Instruments Incorporated, Dallas, Tex.

[21] Appl. No.: 737,812

[22] Filed: Nov. 1, 1976

Related U.S. Application Data

[63] Continuation of Ser. No. 502,472, Sept. 3, 1974, abandoned.

[51] Int. Cl.$^2$ .................................. H01L 21/88
[52] U.S. Cl. ........................ 156/643; 29/578; 156/649; 156/656; 204/192 E; 427/89; 427/98
[58] Field of Search ............... 156/2, 3, 8, 13, 17, 156/18, 11; 204/192 E, 192 EC; 427/98, 89, 430; 134/21; 29/578; 357/71

[56] References Cited

U.S. PATENT DOCUMENTS

| | | | |
|---|---|---|---|
| 3,386,894 | 6/1968 | Steppat | 29/578 |
| 3,642,548 | 2/1972 | Eger | 156/13 |
| 3,657,029 | 4/1972 | Fuller | 156/11 |
| 3,795,557 | 3/1974 | Jacob | 156/8 |
| 3,900,944 | 8/1975 | Fuller et al. | 204/192 EC |
| 3,951,709 | 4/1976 | Jacob | 156/8 |

*Primary Examiner*—Charles E. Van Horn
*Assistant Examiner*—Jerome W. Massie
*Attorney, Agent, or Firm*—Harold Levine; James T. Comfort; Gary C. Honeycutt

[57] ABSTRACT

The disclosure relates to patterning of platinum effectively and then removing the mask from the platinum without attacking the chromium metal beneath the platinum. If tantalum is used on top, which metal can be patterned with CF$_4$, the tantalum can be patterned and the platinum can then be patterned quite readily and the tantalum can then be removed with the CF$_4$ again and then the gold can be plated up onto the platinum patterns and the chromium can then be etched out using conventional chromium etch which will not attack any of the other metals.

This solves the problem of high yield patterning with a metal mask and process for patterning and removal of that metal mask that is compatible with the chromium-platinum metal system. The advantage of the chromium-platinum system over the titanium-platinum system is the resistance of the chromium to silicon etch. Therefore, the principal application of this invention would be in the fabrication of mesa devices.

8 Claims, 3 Drawing Figures

METHOD OF PATTERNING CR-PT-AU METALLIZATION FOR SILICON DEVICES

This is a continuation, of application Ser. No. 502,472, filed Sept. 3, 1974, now abandoned.

This invention relates to a method of patterning Cr-Pt-Au metallization for silicon devices and, more specifically, to a method of effectively patterning platinum over chromium without removing the chromium when removing the mask required for patterning the platinum.

In using the Cr-Au process for making mesa diodes, platinum is required between the chromium and the gold to make the system metallurgically stable so that in reality there is a chromium-platinum-gold system. The gold itself is deposited by electro deposition onto the platinum. To do this, it is necessary, to first pattern the platinum. Patterning platinum is difficult because it does not etch well and is etched only by aqua regia. In the present state of the art, this is done by using conventional photoresist, but the yield is not optimum because the aqua regia that patterns the platinum will also attack the photoresist. This invention is primarily to allow patterning of the platinum effectively and then removing the mask from the platinum without attacking the chromium metal beneath the platinum. The chromium metal must be left beneath the platinum because it is necessary to electro deposit, so it is necessary to have island patterns of platinum with an equipotential plane of chromium thereunder which is not patterned. Chromium can be used for patterning the platinum, but when the chromium is removed from the top of the platinum to electro deposit the gold, the chromium is also removed from the bottom layer and therefore there would not be any equi-potential plane. If tantalum is used on top, which metal can be patterned with $CF_4$, the tantalum can be patterned and the platinum can then be patterned quite readily and the tantalum can then be removed with the $CF_4$ again and then the gold can be plated up onto the platinum patterns and the chromium can then be etched out using conventional chromium etch which will not attack any of the other metals. So the entire system is etch compatible in that what is used to pattern the tantalum does not attack the platinum or the chromium; what is used to pattern the platinum does not attack the tantalum or the chromium; and finally, that which is used for removal of the tantalum does not attack the platinum or the chromium. When the gold is plated up and the chromium is removed, what is used to remove the chromium does not attack the platinum or the gold that is left behind.

This solves the problem of high yield patterning with a metal mask and process for patterning and removal of that metal mask that is compatible with the chromium-plating metal system. The advantage of the chromium-platinum system over the titaniumplatinum system is the resistance of the chromium to silicon etch. Therefore, the principal application of this invention would be in the fabrication of mesa devices.

It is therefore an object of this invention to provide a method of patterning platinum over a copper layer without affecting the copper layer.

It is a further object of this invention to provide a method of patterning Cr-Pt-Au metallization for making mesa diodes.

It is a yet further object of this invention to provide a tantalum mask over a Cr-Pt system for patterning of the platinum.

Figure 2:
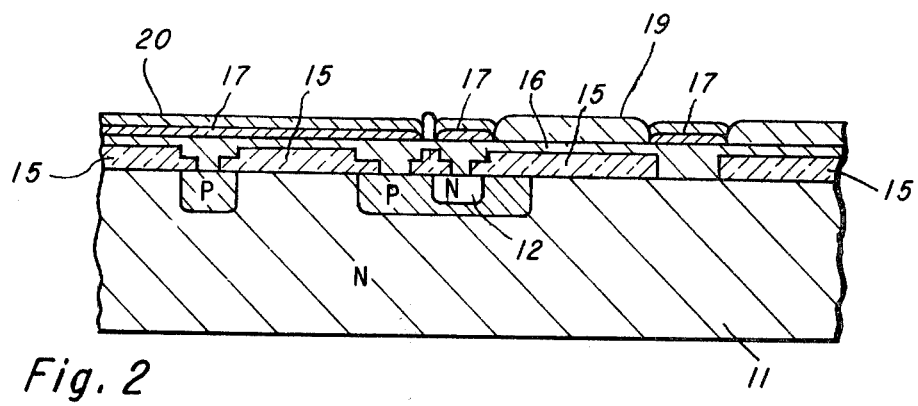
Figure 3:
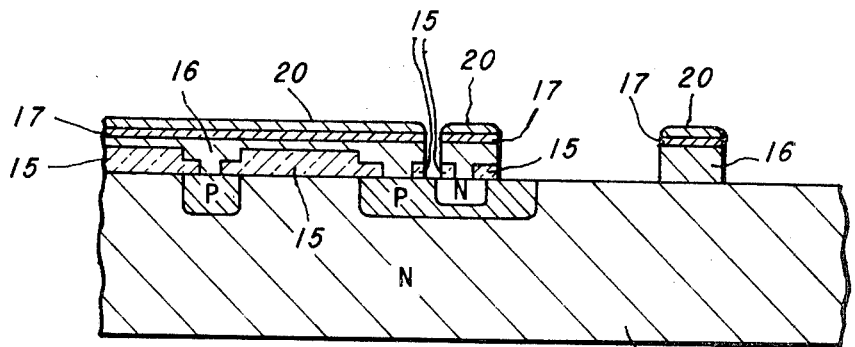

The above objects and still further objects of the invention will immediately become apparent to those skilled in the art after consideration of the following preferred embodiment thereof, which is provided by way of example and not by way of limitation, wherein:

FIGS. 1 through 3 are cross-sectional views of a semiconductor structure, illustrating successive stages in fabricating the preferred embodiment of the invention.

Referring first to FIG. 1, there is shown a semiconductor wafer 11, preferablly formed of silicon, though other semiconductor materials could be used. The wafer 11 is processed by any suitable technique to provide therein the indicated region of N-type and P-type conductivity. The structure illustrated is a portion of an integrated circuit structure to be provided with the necessary metal interconnection system. An N-P-N transistor is formed by emitter 12 and base 13 in combination with substrate 11 which serves as a collector region. P-type region 14 is a resistor element to be connected electrically with transistor base region 13. An insulating layer 15, typically silicon dioxide, for example, covering the surface of wafer 11, acquires a stepped configuration, as shown, during the successive diffusion operations. Thereafter, openings or windows are sleectively etched in the oxide layer to permit ohmic contract with each of the respective conductivity regions by the first metallization level. Also, the silicon surface exposed by the ohmic contact holes in oxide layer 15 are covered with a layer of platinum silicide (not shown), if desired, for the purpose of improving ohmic contact with the first metallization level.

Chromium layer 16, platinum layer 17 and tantalum layer 18 are deposited by known techniques, including, for example, vacuum evaporation or sputtering. The tantalum may be deposited in the same or subsequent pump-downs to that used with the chromeplatinum deposition. Tantalum layer 18 is then patterned, using photolithographic masking and a plasma-vapor etch in $CF_4$, this being a selective etch to provide the appropriate pattern for use as a mask in the subsequent etching of platinum layer 17. For example, the tantalum layer 18 is first covered with a suitable photoresist composition which is selectively exposed to a suitable light source and then developed to provide the exact pattern required. A suitable etch for the removal of the exposed tantalum pattern is $CF_4$ as noted above. After removal of the tantalum with $CF_4$, the structure will be as shown in FIG. 1.

The structure shown in FIG. 1 is then immersed in aqua regia for the purpose of removing the exposed portions of the platinum layer 17. The aqua regia does not appreciably attack the tantalum mask or chromium layer 16 due to the passivating effect of oxides initially formed upon reaction with the nitric acid contained in aqua regia. After the aqua regia etch, all other resists are removed and the tantalum layer 18 is removed by plasma-vapor etch in $CF_4$. The chromium layer 16 and the platinum layer 17 will not be attacked by the $CF_4$ plasma-vapor etch.

Referring now to FIG. 2, there is shown the resulting pattern formed in the platinum layer 17 with the chromium layer 16 thereunder. A photoresist pattern 19 is then applied at all points where the chromium layer 16 is exposed to the upper surface as shown in FIG. 2 with the patterned platinum region 17 being exposed to the surface with no photoresist thereon. A layer of gold 20 is then plated onto the platinum regions 17 to a thickness compatible with device or circuit requirements using solutions and techniques well known in the art. Techniques such as vacuum evaporation or sputtering can be used. The photoresist layer 19 is then removed by well known means and the chromium layer 16 is then etched in the exposed region using the platinum-gold layer as a mask and using etches based on ceric sulfate or ceric ammonium nitrate. For example, the solution can be prepared from 50 mililiters of 0.5 N ceric sulfate in 2N sulfuric acid and 35 mililiters concentrated nitric acid diluted with water to yield 135 mililiters of etching solution. Hydrochloric acid solutions may be used to etch chromium, however, they are generally inferior to the ceric reagents.

Referring now to FIG. 3, there is shown a structure after the photoresist layer 19 has been removed and the chromium layer 16 has been etched as set forth hereinabove. It can be seen in FIG. 3 that in those regions where the chromium layer 16 and the $SiO_2$ layer 15 have been removed, the silicon layer 11 is exposed to the upper surface. The oxide layer would be removed in regions where silicon etching is to be done. The chromium-platinumgold layers 16, 17 and 20 will serve as an etch mask for the $HNO_3$—HF base silicon etch which would now be used to provide any etching in the region 11.

It can be seen that there has been provided a method which solves the problem of high yield patterning of platinum which a metal mask process for patterning and removal of that metal mask that is compatible with the Cr-Pt metal system. The advantage of the Cr-Pt system over the Ti-Pt system is the resistance of the chromium to silicon etch. Therefore, the principal application of this invention would be in the fabrication of mesa devices.

Though the invention has been described with respect to a specific preferred embodiment thereof, many variations and modifications will immediately become apparent to those skilled in the art. It is therefore the intention that the appended claims be interrupted as broadly as possible in view of the prior art to include all such variations and modifications.

What is claimed is:

1. A method of forming a patterned platinum layer over a chromium layer which comprises the steps of:
    a. forming a layer of platinum over said chromium layer,
    b. forming a layer of tantalum over said platinum,
    c. patterning said tantalum by a plasma-vapor etch to form a mask over said platinum,
    d. patterning said platinum through said tantalum mask,
    e. removing the remaining tantalum by a $CF_4$ plasmavapor etch, whereby the initial chromium layer is left intact due to the selectivity of the $CF_4$ plasma-vapor etch for tantalum, and
    f. selectively plating gold onto the platinum.

2. A method as set forth in claim 1 wherein said layers are formed on a semiconductor slice.

3. A method as set forth in claim 2 wherein said tantalum layer is patterned using a $CF_4$ etch.

4. A method as set forth in claim 2 wherein said platinum layer is patterned using aqua regia.

5. A method as set forth in claim 3 wherein said platinum layer is patterned using aqua regia.

6. A method as set forth in claim 1 wherein said tantalum layer is patterned using a $CF_4$ etch.

7. A method as set forth in claim 6 wherein said platinum layer is patterned using aqua regia.

8. A method as set forth in claim 1 wherein said platinum layer is patterned using aqua regia.